United States Patent
Vandenberg et al.

(10) Patent No.: US 6,977,540 B2
(45) Date of Patent: Dec. 20, 2005

(54) HIGH-SPEED ISOLATED PORT

(75) Inventors: Dennis Vandenberg, Placentia, CA (US); Timothy Richards, Costa Mesa, CA (US); Douglas G. Gilliland, Chicago, IL (US)

(73) Assignee: ADC DSL Systems, Inc., Eden Prairie, MN (US)

( * ) Notice: Subject to any disclaimer, the term of this patent is extended or adjusted under 35 U.S.C. 154(b) by 271 days.

(21) Appl. No.: 10/370,161

(22) Filed: Feb. 18, 2003

(65) Prior Publication Data

US 2004/0160719 A1 Aug. 19, 2004

(51) Int. Cl.$^7$ .......................... H03K 17/78; H03L 5/00
(52) U.S. Cl. ...................... 327/514; 327/333
(58) Field of Search .............. 327/514, 333, 327/379; 250/551; 375/220

(56) References Cited

U.S. PATENT DOCUMENTS

| | | | |
|---|---|---|---|
| 3,742,947 A * | 7/1973 | Hashem | 600/508 |
| 3,811,094 A * | 5/1974 | Lee | 330/59 |
| 3,867,567 A * | 2/1975 | Herron et al. | 178/3 |
| 3,902,060 A * | 8/1975 | Neuner et al. | 398/209 |
| 3,912,951 A * | 10/1975 | Kihara | 327/223 |
| 4,056,719 A * | 11/1977 | Waaben | 398/158 |
| 4,081,787 A * | 3/1978 | Lee | 250/551 |
| 4,143,287 A * | 3/1979 | Biggs | 327/205 |
| 4,355,237 A * | 10/1982 | Harris, Jr. | 250/551 |

* cited by examiner

Primary Examiner—Tuan T. Lam
(74) Attorney, Agent, or Firm—Fogg and Associates, LLC; Laura A. Ryan

(57) ABSTRACT

A port isolator apparatus includes an optical isolator circuit that electrically isolates an input circuit from a high-speed output circuit. The input circuit uses a transistor to control the current flow of a data signal into the optical isolator. The optical isolator generates, from the data signal, an output signal that controls the high-speed output circuit in the regeneration of the output signal. The output signal is substantially similar to the input data signal. The input circuit and the optical isolator circuit are coupled to one power and ground circuit while the high-speed output circuit is coupled to a second power and ground circuit that is isolated from the first power and ground circuit.

19 Claims, 8 Drawing Sheets

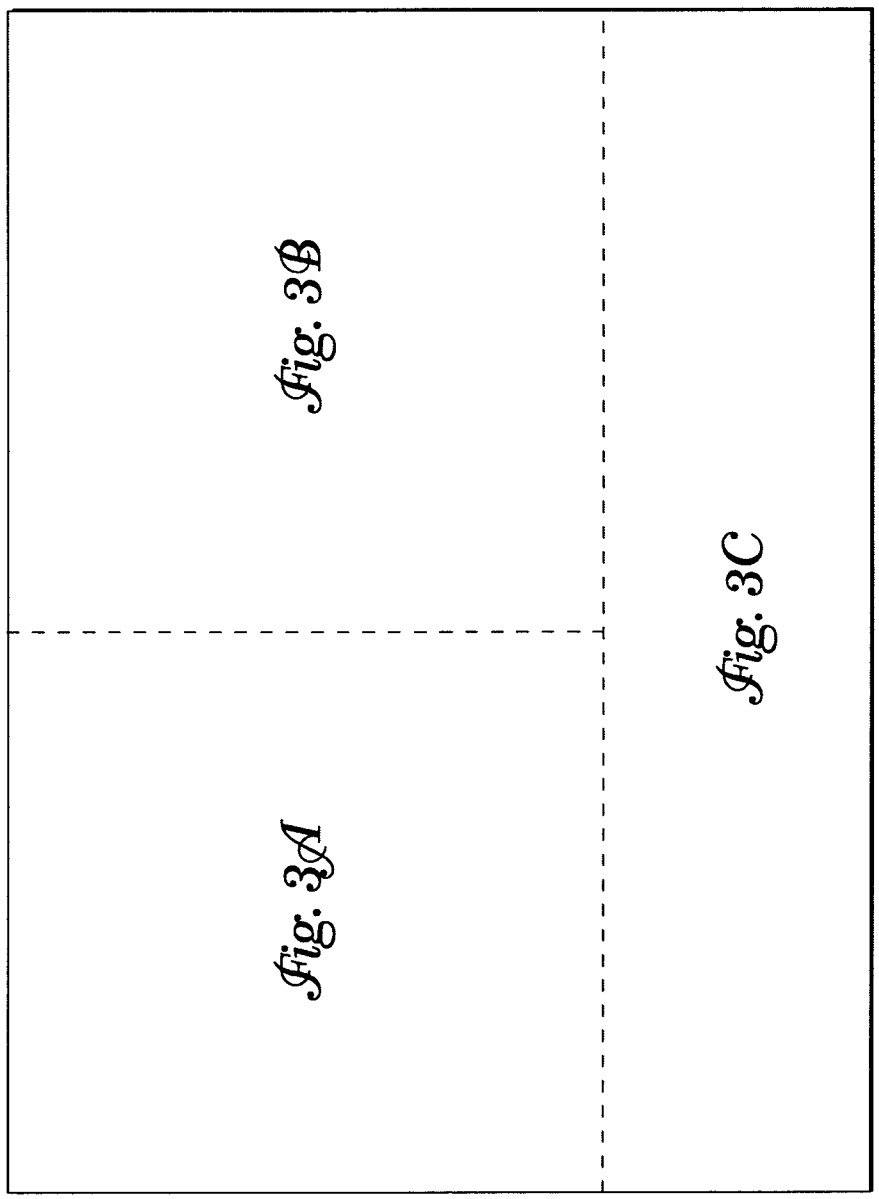

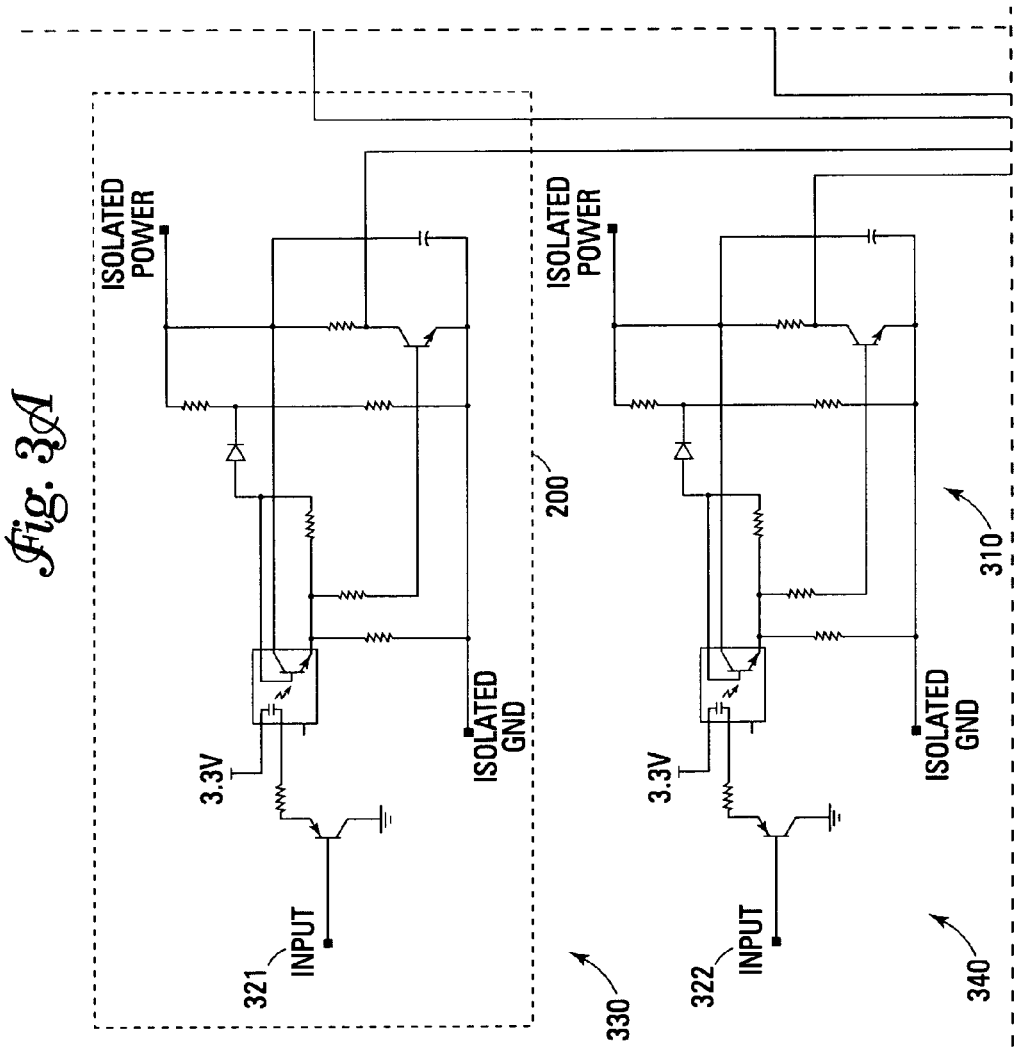

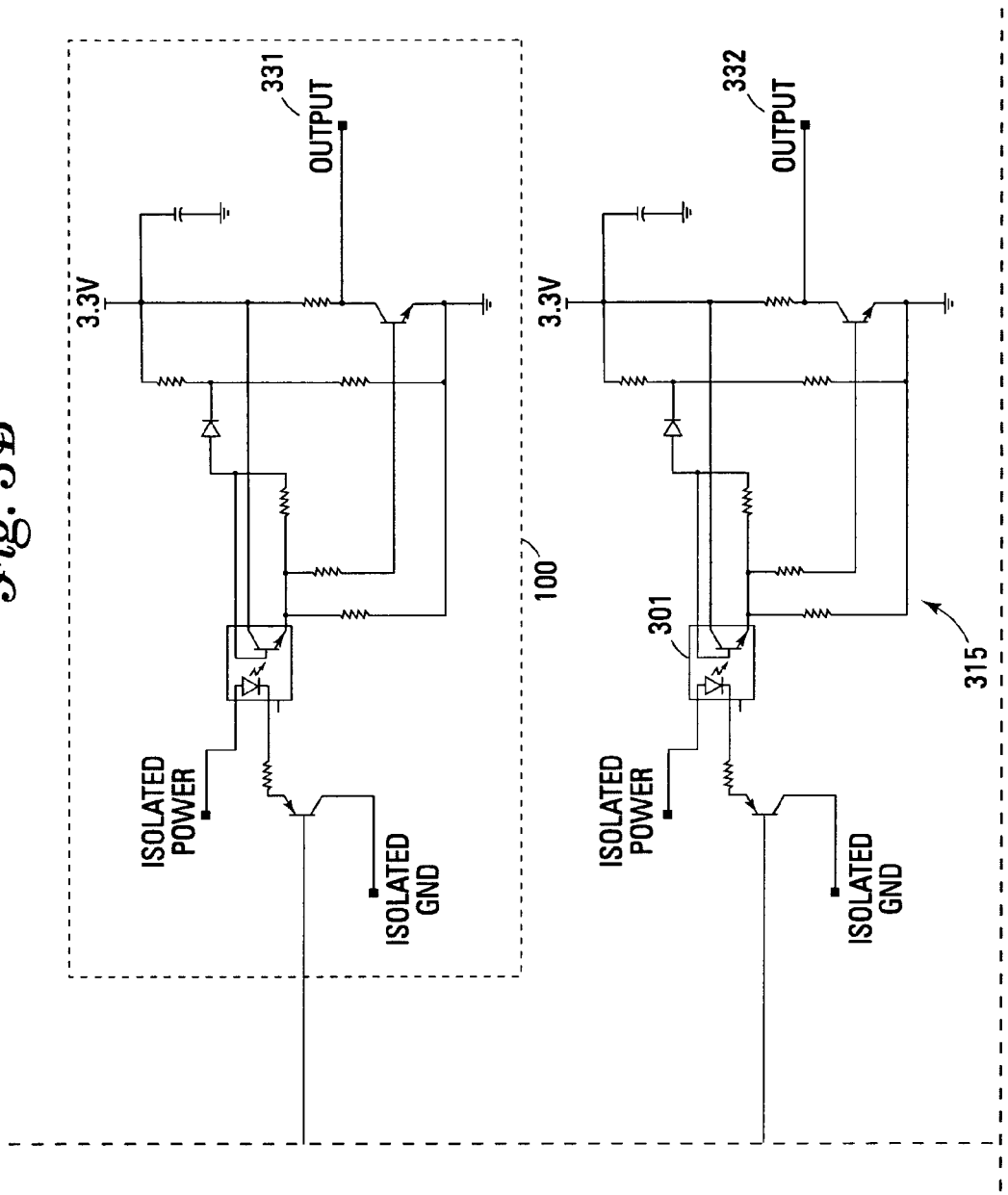

US 6,977,540 B2

HIGH-SPEED ISOLATED PORT

TECHNICAL FIELD

The present invention relates generally to the ground isolation of electronic systems and particularly to isolation of separate high-speed electronic system grounds during high-speed data transfer.

BACKGROUND

Electrical system grounds provide a circuit with a complete path to enable the flow of current. However, since separate electrical systems typically have different grounding schemes, connecting the separate systems together can cause ground loop problems in which an electrical potential develops between the systems. This potential between the grounds causes unwanted current flow that can degrade data signals, produce excessive electromagnetic interference, and damage components.

An example of such a problem is a telephone repair worker who plugs diagnostic equipment (e.g., portable computer) into a port to effect repairs to a circuit. The diagnostic equipment has its own ground scheme and the circuit under repair has a separate ground scheme. In such a case, the diagnostic equipment needs to be isolated from the circuit under repair to prevent damage to either the diagnostic equipment or the circuit.

One way to isolate the diagnostic equipment from the circuit is by an optical isolator. The optical isolator transforms an input electrical signal into an optical signal and then back to an electrical signal, thus isolating the input signal ground from the output signal ground. The problem with optical isolators is that they limit the speed of data transfers to lower speed operations such as 9600 bps or 19.2 kbps. This is due to the transition time of an optical isolator being slower than the switching frequency of the interface. In other words, the optical isolator circuit is trying to switch so fast that the output signal does not have adequate time to make full transitions. There is a resulting need in the art for a way to isolate circuit grounds of coupled data ports while improving data transfer rates between circuits.

SUMMARY

The embodiments of the present invention encompass a high-speed isolated port apparatus. The apparatus comprises an input circuit that generates an input signal in response to a data signal. An output circuit generates an output signal that, in response to a control signal, substantially replicates the data signal. An optical isolator circuit is coupled between the input circuit and the output circuit. The optical isolator electrically isolates the input circuit from the output circuit and generates the control signal in response to the input signal. The power and ground circuit for the input circuit is isolated from the power and ground circuit for the output circuit.

BRIEF DESCRIPTION OF THE DRAWINGS

FIG. 3, divided into FIGS. 3A, 3B and 3C shows a schematic diagram of one embodiment of an isolated port device in accordance with the embodiments of the present invention.

DETAILED DESCRIPTION

The embodiments of the present invention provide galvanic isolation between circuits having different ground domains. The apparatus embodiments eliminate the possibility of a ground loop developing while seamlessly passing data signals at data transfer rates that are substantially greater than prior art optically isolated systems.

Figure 1:
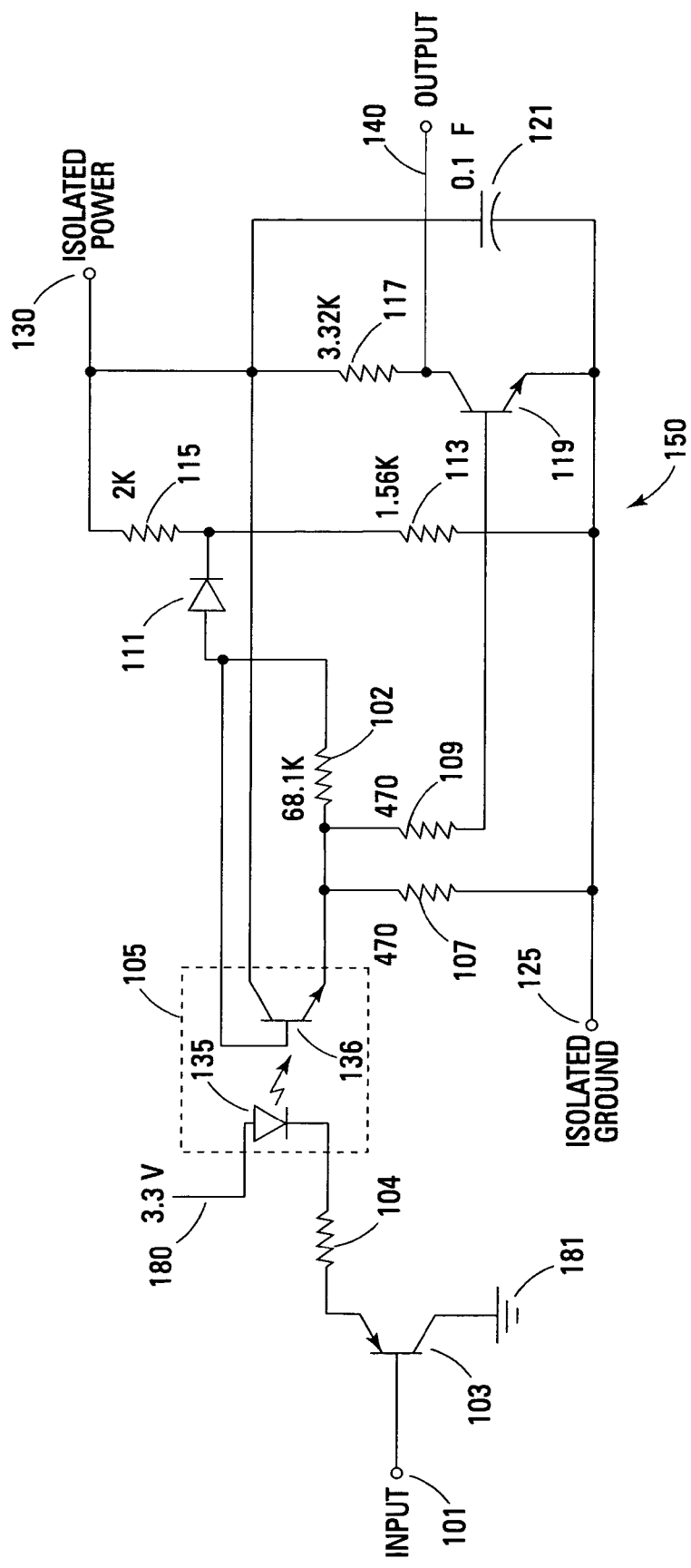
FIG. 1 shows a schematic diagram of one embodiment of a high-speed isolated port apparatus of the present invention.

FIG. 1 illustrates a schematic diagram of one embodiment of the high-speed isolated port apparatus (100) of the present invention. In one embodiment, the schematic of FIG. 1 is used for transmission of data to an isolated electronic system.

In this embodiment, a data signal for transmission is input (101) to the apparatus (100). The data signal includes any data, high-speed (e.g., 200 kHz) or otherwise. The data signal, in another embodiment, is a periodic clock. Alternate embodiments include other forms of data signals.

The input (101) that receives the input data signal is coupled to the base input of a pnp-type transistor (103). Alternate embodiments use other types of transistors.

The transistor (103) with a current limiting resistor (104) connected to the emitter are part of an input circuit that generates an input signal and controls the current flow to the light emitting diode (LED) (135) of an optical isolator circuit (105). When the LED (135) is activated by the input signal from the transistor, the detector side transistor (136) of the isolator (105) is also activated.

The output signal of the optical isolator (105) is used as a control signal to drive a high-speed isolated output circuit (150). The isolated circuit (150) regenerates the optical isolator's output signal. The regenerated output signal of the isolated circuit (150) is then used in place of the optical isolator's output signal.

The isolated circuit (150) is comprised of circuit elements that include four resistors (102, 107, 113, and 115) that are used in conjunction with a diode (111) to condition the output signal from the optical isolator (105) so that the signal can control an npn-type output transistor (119) through its base input. Alternate embodiments use other types of transistors.

The resistor (102) forms a base-emitter bleed resistor, resistor (107) forms and emitter follower resistor to the isolated ground, and resistors (113 and 115) form a voltage divider with the isolated circuit power source (130) and isolated ground (125) in order to generate the proper base voltage to turn on the transistor (119). The voltage divider (113 and 115) generates a reference voltage that is coupled to the cathode of diode (111). The diode (111) generates a maximum voltage reference point of 0.70 V above that of the voltage divider (113 and 115) voltage. This maximum reference point voltage limits the peak voltage at the based of the transistor (136) and the base-emitter bleed resistor (102). The voltage divider (113 and 115), and the diode (111) limit the peak voltage to 1.2V at the emitter of transistor (136) for application to the base input of the output transistor (119).

One resistor (109) limits the current to the base of the output transistor (119). Another resistor (117) limits the current through the transistor (119) and the output (140). The transistor output signal is discussed subsequently with reference to FIG. 4.

The power (180) and ground (181) connections for the optical isolator (105) and the input transistor (103) are associated with the input signal and input circuitry. The isolated circuit power (130) and ground (125) of the isolated circuit (150) are connected to a power supply that is isolated from the input power (180) and ground (181). The isolated power (130) and ground (125) are associated with the output signal and output circuitry. In one embodiment, the isolated circuit power source is 3.30 VDC. Alternate embodiments use other voltage levels since the isolated circuit (150) of the present invention is not limited to any one voltage.

The resistance values of the resistors (102, 107, 109, 113, 115, and 117) of the embodiment of FIG. 1 are for illustration purposes only. These values vary according to the properties and bias voltages required by the output transistor (119). For example, if a different isolated circuit power source voltage is used, the resistance values required to generate the output transistor bias voltages will be different. This will affect the voltage range of the output signal.

An output capacitor (121) is added across the output transistor (119) and resistor (117) to filter noise from the isolated power source (130). This capacitor (121) is not required for proper operation of the embodiments of the present invention.

The advantage of using the output signal of the optical isolator (105) as a control signal for the isolated circuit (150) is that the signal only needs to swing enough to turn on the output transistor (119). If the output transistor (119) has a narrow enough turn-on range, the output signal will have sharp transitions.

Figure 2:
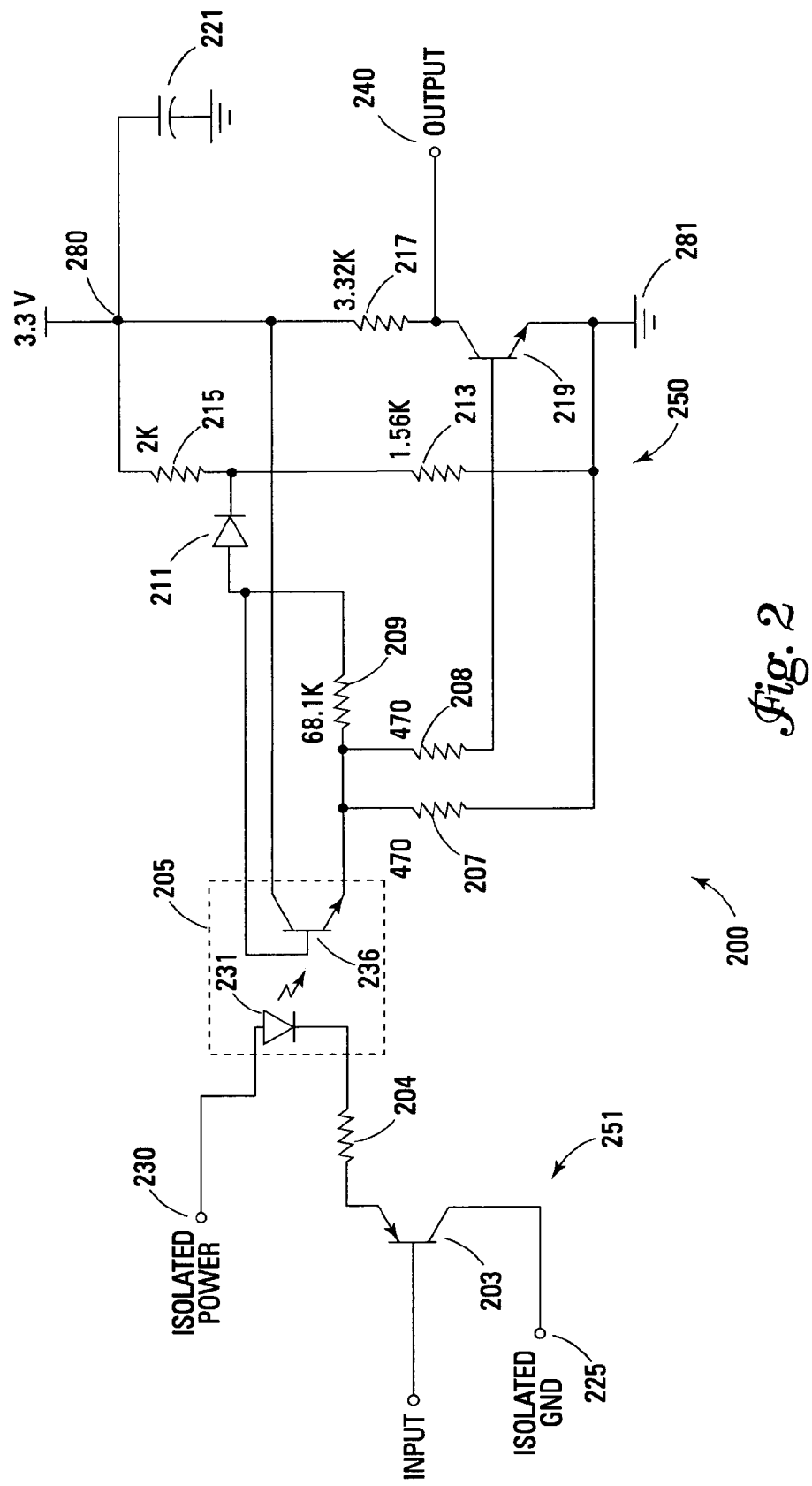
FIG. 2 shows a schematic diagram of another embodiment of the high-speed isolated port apparatus of the present invention.

FIG. 2 illustrates a schematic diagram of another embodiment of the high-speed isolated port apparatus of the present invention. In one embodiment, this circuit receives high-speed data from an isolated electronic system.

The embodiment of FIG. 2 provides the same isolation function as that of FIG. 1. This embodiment is different from FIG. 1 in that input circuit (251) is the isolated circuit. In this embodiment, the isolated power source (230) is coupled to the LED (231) of the optical isolator (205). The isolated ground is coupled to the collector of the input transistor (203). The output circuitry is coupled to a separate output power source (280) and ground (281). In one embodiment, the isolated power source (230) is 3.30 VDC. Alternate embodiments use other voltage levels.

As in the embodiment of FIG. 1, the received input signal is coupled to the base of the input transistor (203). In one embodiment, this transistor is a pnp-type transistor (203). Alternate embodiments use other types of input transistors.

The transistor (203) with a current limiting resistor (204) connected to the emitter are part of an input circuit that controls the current flow to the LED (231) of the optical isolator (205). When the LED (231) is activated, the detector side transistor (236) of the isolator (205) is also activated.

The output signal of the optical isolator (205) is used as a control signal to drive a high-speed isolated output circuit (250). The isolated circuit (250) regenerates the optical isolator's output signal. The regenerated output signal of the isolated circuit (250) is then used in place of the optical isolator's output signal.

The isolated circuit (250) is comprised of circuit elements that include four resistors (207, 209, 213, and 215) that are used in conjunction with a diode (211) to condition the output signal from the optical isolator (205) so that the signal can control the base of an npn-type output transistor (219). Alternate embodiments use other types of output transistors.

The resistor (209) forms a base-emitter bleed resistor, resistor (207) forms an emitter follower resistor to ground, and resistors (213, and 215) form a voltage divider with the output circuit power source (280) and ground (281) in order to generate the proper base voltage to turn on the output transistor (219). The voltage divider (213 and 215) generates a reference voltage that is coupled to the cathode of the diode (211). The diode (211) generates a maximum voltage point at the anode of diode (211) of 0.70 V above that of the voltage divider (213 and 215) voltage. This maximum voltage reference point voltage limits the peak voltage at the base of the transistor (236) and the base-emitter bleed resistor (209). The voltage divider (213 and 215), and the diode (211) limit the peak voltage to 1.2V at the emitter of transistor (236) for application to the base input of the output transistor (219).

One resistor (208) limits the current to the base of the output transistor (219). Another resistor (217) limits the current through the transistor (219) and the output (240). The transistor output signal is discussed subsequently with reference to FIG. 4.

An output capacitor (221) is added across the output transistor (219) and resistor (217) to reduce noise from the power source. This capacitor (221) is not required for proper operation of the embodiments of the present invention.

The resistance values of the resistors (207, 208, 209, 213, 215, and 217) of the embodiment of FIG. 2 are for illustration purposes only. These values vary according to the properties and bias voltages required by the output transistor (219). For example, if a different output circuit power source voltage is used, the resistance values required to generate the output transistor bias voltages will be different. This will affect the voltage range of the output signal.

The present invention is not limited to the embodiments illustrated in FIGS. 1 and 2. Alternate embodiments use different circuit elements to perform substantially similar functions as the input and output circuits described previously.

FIG. 3 illustrates a schematic diagram of one embodiment of an isolated port device (300) in accordance with the present invention. The isolated port device (300) can be used in any electronic device in a system requiring high-speed data ports that need to be isolated while high-speed data is being transferred between electronic devices. Typical examples of such electronic devices include computers, modems, and personal digital assistants. In the embodiment of FIG. 3, the high-speed isolated port apparatuses of the embodiments of FIGS. 1 and 2 are incorporated into the isolated port device.

Figure 3C:
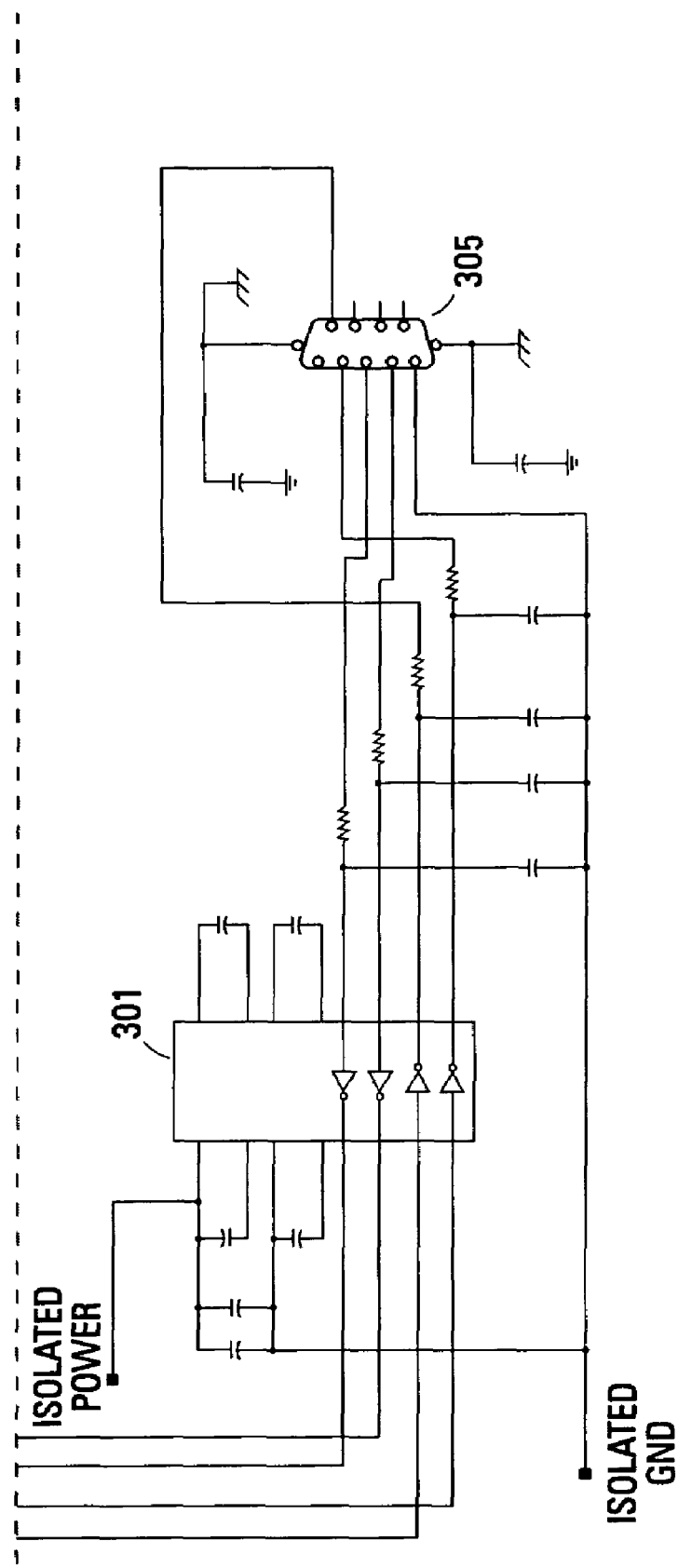

The device of FIG. 3 includes a data channel (330), shown in FIG. 3A, that has a transmit high-speed isolated port apparatus (200) and a receive high-speed isolated port apparatus (100). The high-speed isolated port apparatuses are coupled to a connector (305), shown in FIG. 3C, through a buffer circuit (301), shown in FIG. 3C, that increases the current of received and transmitted signals. The buffer circuit (301) is connected to the same isolated circuit power source and isolated ground as the isolated portions of the high-speed isolated port apparatuses.

In one embodiment, the connector is a 9-pin RS232-type connector that connects the isolated port device of FIG. 3 to another electronic device. For example, the connector can be connected to an electronic device under test, a computer, a modem, or some other electronic device. Alternate embodiments use other types of connectors. The type of connector used depends on the type of electronic device to which the embodiment of FIG. 3 is to be connected.

In one embodiment, the isolated port device of FIG. 3 includes a second data channel (340), shown in FIG. 3A, that has additional high-speed isolated port apparatuses (310 and 315), shown in FIGS. 3A and 3C, respectively. A second transmit (310) and a second receive (315) high-speed isolated port apparatus are illustrated in FIG. 3. However, the embodiments of the present invention are not limited to such a configuration. Alternate embodiments have additional data channels or data channels that include only a receive or only a transmit high-speed isolated port apparatus.

The inputs (321 and 322) of the data channels (330 and 340) are coupled to data output circuitry that require data to be transmitted. For example, in one embodiment, one of the inputs (321 or 322) is coupled to a controller or central processing unit (CPU).

The outputs (331 and 332) of the data channels (330 and 340) are coupled to data receive circuitry that receives data from outside sources. In one embodiment, one of the outputs (331 or 332) is coupled to the controller or a serial data transceiver.

The circuit element values and power supply voltage levels of the embodiment of FIG. 3 are for purposes of illustration only. Alternate embodiments use different values and different power supply voltage levels. For example, if the outputs of the high-speed isolated port apparatuses are desired to be at 5.0 V, a 5.0 VDC power supply would be used and different resistance values may be required to achieve substantially similar results to the embodiment of FIG. 3.

Figure 4:
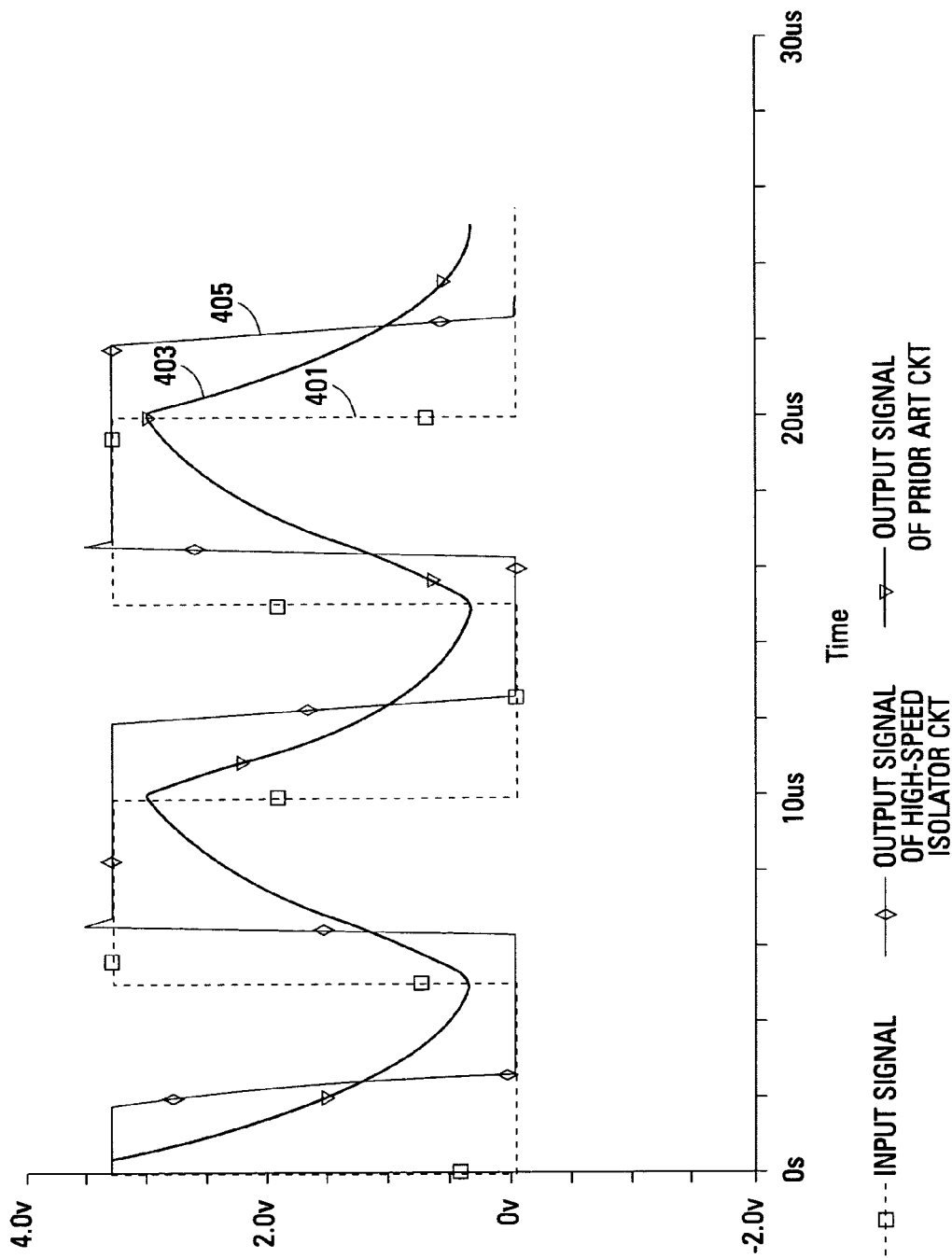
FIG. 4 shows a graphical plot of a comparison of an input signal, a prior art output signal, and an output signal of one embodiment of the high-speed isolated port apparatus of the present invention.

FIG. 4 shows a graphical plot of a comparison of an input signal, a prior art output signal, and an output signal of one embodiment of the high-speed isolated port apparatus of the present invention. The input signal (401) is a 100 kHz, 3.30 V square wave signal. Alternate embodiments use other input signals as discussed previously.

An output signal (403) of a prior art optical isolator circuit is overlaid on the graph of FIG. 4. It can be seen that this signal (403), due to its high speed through the slow prior art circuit, never reaches either the 3.30 V level or returns to zero. Also due to its high speed, the prior art output signal (403) becomes more of a sawtooth signal since the output circuitry never has time to fully turn on.

The output signal (405) of the high-speed isolated port apparatus of the present invention shows that the embodiments of the apparatus of the present invention provides a clean square wave that substantially replicates the input signal (401). The output signal (405) is only shifted somewhat in time from the input signal (401) due to typical circuit delay.

Figure 5:
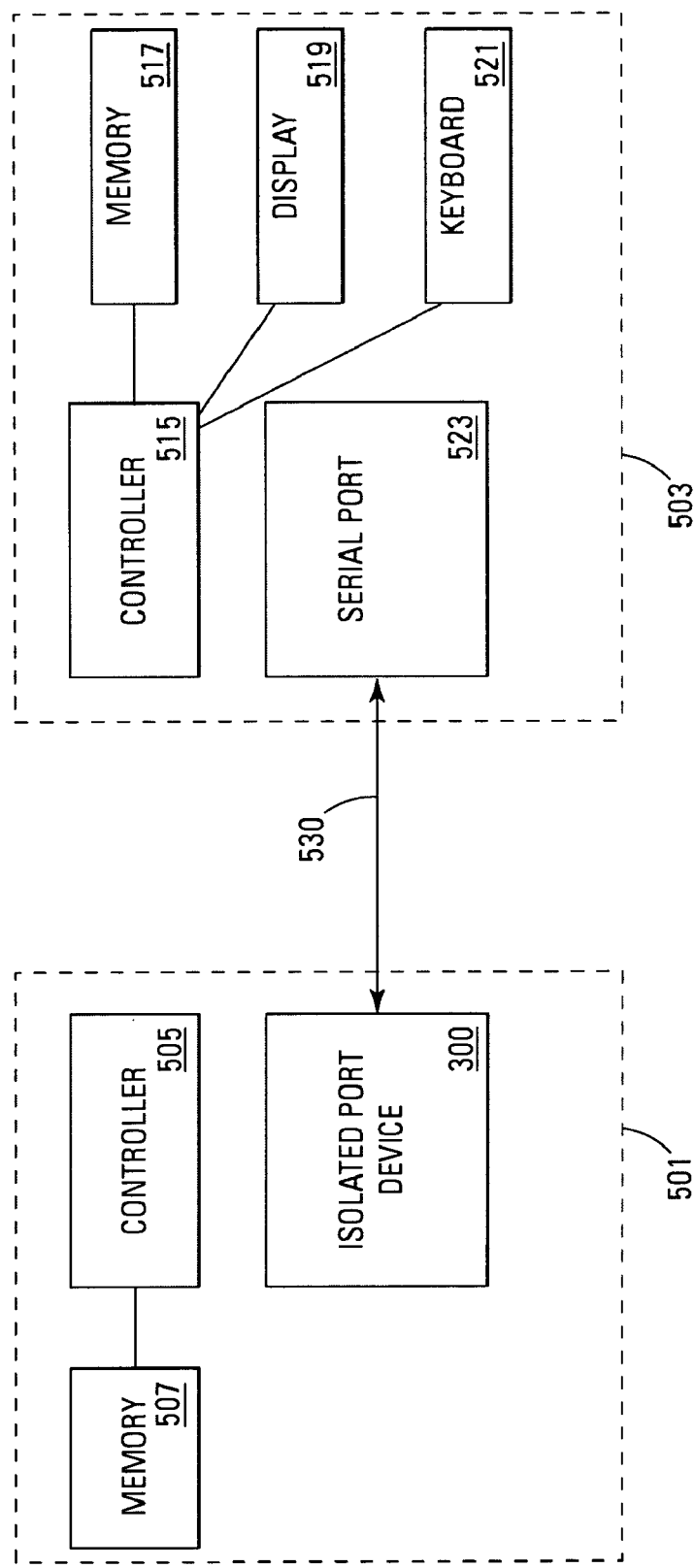
FIG. 5 illustrates a block diagram of one embodiment of an isolated port system in accordance with the present invention.

FIG. 5 illustrates a block diagram of one embodiment of an isolated port system in accordance with the present invention. The system includes at least two separate electronic devices (501 and 503) that are coupled through a data link (530). The data link can be any type of wire, cable, optical fiber, or wireless link.

At least one of the electronic devices (501 or 503) includes a high-speed isolated port device (300) of the present invention. The device (300) provides the galvanic isolation that may be required between the electronic devices (501 and 503).

The high-speed isolated port device (300) is coupled to a controller (505) that provides the data to be transmitted to the second electronic device (503) through the isolated port device (300). The controller (505) also receives any data that has been transmitted from the second electronic device (503) through the isolated port device (300). The controller is a central processing unit or any other type of controlling circuit.

Memory (507) stores the data that is to be transmitted or has been received. The memory is any type of memory including disk drives, semiconductor memory, and/or optical memory.

The second electronic device (503) is a computer that receives and transmits data through a serial port (523) to the first electronic device (501). The computer includes a controller (515) or other type of processor, memory (517), a display (519) to display data, and a keyboard (521) for entering data.

The system of FIG. 5 is for purposes of illustration only. The system illustrated shows only one use of the high-speed isolated port apparatus of the embodiments of the present invention. Alternate embodiments of the system of FIG. 5 are encompassed by the present invention.

In summary, the embodiments of the high-speed isolated port apparatus of the present invention provide galvanic isolation, for safety or operational reasons, between two separate electronic systems. The two electronic systems can be connected through the high-speed isolated port apparatus in order to transfer data. This is accomplished by using the output of an optical isolator to trigger a high-speed output circuit that is electrically isolated from an input circuit.

Numerous modifications and variations of the present invention are possible in light of the above teachings. It is therefore to be understood that within the scope of the appended claims, the invention may be practiced otherwise than as specifically described herein.

What is claimed is:

1. An isolated port apparatus comprising:
   an input circuit that generates an input signal in response to a data signal, the input circuit coupled to a first power and ground circuit;
   an output circuit that, in response to a control signal, generates an output signal that substantially replicates the data signal, the output circuit coupled to a second power and ground circuit that is isolated from the first power and ground circuit; and
   an optical isolator circuit that electrically isolates the input circuit from the output circuit, the optical isolator circuit generating the control signal in response to the input signal;
   wherein the output circuit comprises a plurality of circuit elements coupled to an output transistor, the plurality of circuit elements conditioning the control signal for input to a base input of the output transistor;
   wherein the plurality of circuit elements provide a voltage divider that generates a reference voltage for the control signal that is appropriate for the output transistor; and
   a diode, coupled between the voltage divider and a base of a first transistor of the optical isolator, that generates a maximum reference voltage level for the control signal in response to the reference voltage.

2. The apparatus of claim 1 wherein the input circuit comprises an input transistor that controls current into the optical isolator circuit in response to the data signal.

3. The apparatus of claim 1 wherein the optical isolator circuit is coupled to the first power and ground circuit.

4. The apparatus of claim 1 wherein the second power and ground circuit is isolated from any power and ground circuits coupled to the apparatus, including the first power and ground circuit.

5. A high-speed isolated port apparatus comprising:
an input circuit that generates an input signal in response to a data signal, the input circuit coupled to a first power and ground circuit;
an isolated output circuit that, in response to a control signal, generates an output signal that substantially replicates the data signal, the isolated output circuit coupled to a second power and ground circuit that is isolated from any power and ground circuits coupled to the apparatus; and
an optical isolator circuit, coupled to the first power and ground circuit, that electrically isolates the input circuit from the isolated output circuit, the optical isolator circuit generating the control signal in response to the input signal,
wherein the output circuit comprises a plurality of circuit elements coupled to an output transistor;
wherein the plurality of circuit elements provide a voltage divider that generates a reference voltage for the control signal that is appropriate for the output transistor; and
a diode, coupled between the voltage divider and a base of a first transistor of the optical isolator, that generates a maximum reference voltage level for the control signal in response to the reference voltage.

6. The apparatus of claim 5 wherein the output circuit comprises a plurality of resistors coupled to an npn-type the output transistor having a base input, the plurality of resistors forming a the voltage divider for creating reference voltage of the control signal for input to the base input, wherein the output transistor is an npn-type output transistor.

7. The apparatus of claim 5 wherein the input circuit comprises a pnp-type input transistor that controls current into the optical isolator circuit in response to the data signal.

8. The apparatus of claim 7 and further including a current limiting resistor coupled between the input transistor and the optical isolator circuit.

9. A high-speed isolated port apparatus comprising:
an input circuit that generates an input signal in response to a data signal, the input circuit coupled to a first power and ground circuit that is isolated from any power and ground circuits coupled to the apparatus;
an isolated output circuit that, in response to a control signal, generates an output signal that substantially replicates the data signal, the isolated output circuit coupled to a second power and ground circuit that is isolated from the first power and ground circuit; and
an optical isolator circuit, coupled to the first power and ground circuit, that electrically isolates the input circuit from the isolated output circuit, the optical isolator circuit generating the control signal in response to the input signal;
wherein the isolated output circuit is coupled to an output transistor and comprises a voltage divider circuit that generates a reference voltage level for the control signal that is appropriate for the output transistor; and
a diode, coupled between the voltage divider and a base of a first transistor of the optical isolator, that generates a maximum reference voltage level for the control signal in response to the reference voltage.

10. The apparatus of claim 9 wherein the input circuit comprises a pnp-type transistor that controls current into the optical isolator circuit in response to the data signal and wherein the output transistor is an npn-type output transistor.

11. An isolated port device comprising:
a first isolated port apparatus comprising:
a first input circuit that generates a first input signal in response to a transmit data signal, the first input circuit coupled to a first power and ground circuit;
a first output circuit that, in response to a first control signal, generates a transmit signal that substantially replicates the transmit data signal, the first output circuit coupled to a second power and ground circuit that is isolated from any power and ground circuits coupled to the isolated port device; and
a first optical isolator circuit, coupled to the first power and ground circuit, that electrically isolates the first input circuit from the first output circuit, the optical isolator circuit generating the first control signal in response to the first input signal; and
a second isolated port apparatus comprising:
a second input circuit that generates a second input signal in response to a received data signal, the second input circuit coupled to the second power and ground circuit;
a second output circuit that, in response to a second control signal, generates an output receive signal that substantially replicates the received data signal, the second output circuit coupled to the first power and ground circuit; and
a second optical isolator circuit, coupled to the second power and ground circuit, that electrically isolates the second input circuit from the second output circuit, the second optical isolator circuit generating the second control signal in response to the second input signal;
wherein the first output circuit comprises a plurality of circuit elements coupled to an output transistor, the plurality of circuit elements conditioning the first control signal for input to a base input of the output transistor;
wherein the plurality of circuit elements provide a voltage divider that generates a reference voltage for the first control signal that is appropriate for the output transistor; and
a diode, coupled between the voltage divider and a base of a first transistor of the first optical isolator, that generates a maximum reference voltage level for the control signal in response to the reference voltage.

12. The device of claim 11 and further including a buffer circuit coupled to the first output circuit and the second input circuit such that the buffer circuit amplifies the transmit signal from the first output circuit for transmission and the buffer circuit amplifies the received data signal for use by the second input circuit.

13. The device of claim 12 wherein the buffer circuit is coupled to the second power and ground circuit.

14. The device of claim 11 and further including a third and a fourth isolated port apparatus that are respectively substantially similar to the first and second isolated port apparatuses.

15. An electronic system comprising:
a controller circuit that controls operation of the electronic system; and
an isolated port device coupled to the controller circuit, the device comprising:
a first isolated port apparatus comprising:

a first input circuit that generates a first input signal in response to a transmit data signal, the first input circuit coupled to a first power and ground circuit;

a first output circuit that, in response to a first control signal, generates a transmit signal that substantially replicates the transmit data signal, the first output circuit coupled to a second power and ground circuit that is isolated from any power and ground circuits coupled to the isolated port device; and a first optical isolator circuit, coupled to the first power and ground circuit, that electrically isolates the first input circuit from the first output circuit, the optical isolator circuit generating the first control signal in response to the first input signal; and a second isolated port apparatus comprising:

a second input circuit that generates a second input signal in response to a received data signal, the second input circuit coupled to the second power and ground circuit;

a second output circuit that, in response to a second control signal, generates an output receive signal that substantially replicates the received data signal, the second output circuit coupled to the first power and ground circuit; and a second optical isolator circuit, coupled to the second power and ground circuit, that electrically isolates the second input circuit from the second output circuit, the second optical isolator circuit generating the second control signal in response to the second input signal;

wherein the first output circuit comprises a plurality of circuit elements coupled to an output transistor, the plurality of circuit elements conditioning the first control signal for input to a base input of the output transistor;

wherein the plurality of circuit elements provide a voltage divider that generates a reference voltage for the first control signal that is appropriate for the output transistor; and a diode, coupled between the voltage divider and a base of a first transistor of the first optical isolator, that generates a maximum reference voltage level for the control signal in response to the reference voltage.

16. The system of claim 15 and further including memory coupled to the controller circuit such that the controller circuit generates the transmit data signal from data stored in the memory.

17. The system of claim 15 and further including memory coupled to the controller circuit into which the controller circuit stores the output receive signal.

18. A method for data communication through an isolated port apparatus:

generating an input signal in response to a data signal in an input circuit that is coupled to a first power and ground circuit;

generating an output signal that, in response to a control signal, substantially replicates the data signal, the output signal generated in an output circuit that is coupled to a second power and ground circuit that is isolated from the first power and ground circuit; and optically isolating the input circuit from the output circuit thereby generating the control signal in response to the input signal;

generating a reference voltage from the second power and ground circuit;

generating a maximum reference voltage level for the control signal using a diode in response to the reference voltage.

19. A high-speed isolated port apparatus comprising:

an input transistor that generates an input signal in response to a data signal, the input transistor coupled to a first power and ground circuit;

an isolated output circuit that, in response to a control signal, generates an output signal that substantially replicates the data signal, the isolated output circuit coupled to a second power and ground circuit that is isolated from the first power and ground circuit, the isolated output circuit comprising:

a voltage divider circuit that generates a reference voltage from the second power and ground circuit;

an output transistor that generates the output signal in response to the control signal with the appropriate voltage level; and an optical isolator circuit, coupled to the first power and ground circuit, that electrically isolates the input circuit from the isolated output circuit, the optical isolator circuit generating the control signal in response to the input signal; and a diode, coupled between the voltage divider circuit and a base of a first transistor of the optical isolator, that generates a maximum reference voltage level for the control signal in response to the reference voltage.

* * * * *

UNITED STATES PATENT AND TRADEMARK OFFICE
CERTIFICATE OF CORRECTION

| | |
|---|---|
| PATENT NO. | : 6,977,540 B2 |
| APPLICATION NO. | : 10/370161 |
| DATED | : December 20, 2005 |
| INVENTOR(S) | : VandenBerg et al. |

It is certified that error appears in the above-identified patent and that said Letters Patent is hereby corrected as shown below:

At Claim 6, Column 7, Line 32, replace the first occurrence of the phrase "to an npn-type the" with --to the--

Signed and Sealed this

Twenty-fifth Day of November, 2008

JON W. DUDAS
*Director of the United States Patent and Trademark Office*